United States Patent
Feng et al.

(10) Patent No.: US 11,563,103 B2
(45) Date of Patent: Jan. 24, 2023

(54) METHOD FOR MANUFACTURING IGBT DEVICE

(71) Applicants: Hua Hong Semiconductor (Wuxi) Limited, Wuxi (CN); SHANGHAI HUAHONG GRACE SEMICONDUCTOR MANUFACTURING CORPORATION, Shanghai (CN)

(72) Inventors: Chao Feng, Wuxi (CN); Zhengrong Chen, Wuxi (CN); Jia Pan, Shanghai (CN); Tinghui Yao, Wuxi (CN); Yu Jin, Wuxi (CN)

(73) Assignees: Hua Hong Semiconductor (Wuxi) Limited, Wuxi (CN); Shanghai Huahong Grace Semiconductor Manufacturing Corporation, Shanghai (CN)

( * ) Notice: Subject to any disclaimer, the term of this patent is extended or adjusted under 35 U.S.C. 154(b) by 0 days.

(21) Appl. No.: 17/230,231

(22) Filed: Apr. 14, 2021

(65) Prior Publication Data
US 2022/0069105 A1    Mar. 3, 2022

(30) Foreign Application Priority Data
Aug. 31, 2020   (CN) .......................... 202010897106.1

(51) Int. Cl.
*H01L 29/66*   (2006.01)
*H01L 21/225*  (2006.01)
*H01L 29/06*   (2006.01)

(52) U.S. Cl.
CPC .... *H01L 29/66325* (2013.01); *H01L 21/2253* (2013.01); *H01L 29/0638* (2013.01)

(58) Field of Classification Search
CPC .......... H01L 29/66325; H01L 21/2253; H01L 29/0638
USPC ....................................................... 438/135
See application file for complete search history.

(56) References Cited

U.S. PATENT DOCUMENTS

| 2011/0095333 | A1* | 4/2011 | Park ................. | H01L 29/7394 438/135 |
| 2012/0104537 | A1* | 5/2012 | Schmidt ............. | H01L 27/0676 438/424 |
| 2013/0187240 | A1* | 7/2013 | Takano .............. | H01L 29/7802 438/510 |
| 2013/0328105 | A1* | 12/2013 | Matsuura ........... | H01L 29/0696 438/138 |
| 2014/0077261 | A1* | 3/2014 | Oshino .............. | H01L 29/0653 257/140 |

(Continued)

*Primary Examiner* — Sheikh Maruf
(74) *Attorney, Agent, or Firm* — Dilworth IP, LLC

(57) ABSTRACT

A method for manufacturing an IGBT device includes: forming a source of the IGBT device in a substrate, wherein the substrate is an MCZ substrate; performing annealing processing on the substrate, wherein a layer of oxide is formed on the surface of the source during an annealing process; forming an interlayer dielectric layer on the substrate, wherein the interlayer dielectric layer is comprised of a silicon nitride layer, a first type oxide layer, and a second type oxide layer, and a material used to form the first type oxide layer is different from a material used to form the second type oxide layer; and performing nitrogen annealing processing on the substrate.

7 Claims, 1 Drawing Sheet

(56) References Cited

U.S. PATENT DOCUMENTS

| | | | |
|---|---|---|---|
| 2014/0235020 A1* | 8/2014 | Arai | H01L 29/404 438/135 |
| 2014/0374793 A1* | 12/2014 | Miyazaki | H01L 29/66348 438/530 |
| 2015/0228717 A1* | 8/2015 | Hara | H01L 29/0638 257/140 |
| 2015/0235866 A1* | 8/2015 | Nakamura | H01L 29/8611 257/77 |
| 2015/0294984 A1* | 10/2015 | Cheng | H01L 21/7624 438/151 |
| 2015/0303268 A1* | 10/2015 | Ishimaru | H01L 29/8611 257/608 |
| 2015/0311279 A1* | 10/2015 | Onozawa | H01L 29/66333 438/530 |
| 2017/0018434 A1* | 1/2017 | Onozawa | H01L 21/3223 |
| 2017/0069625 A1* | 3/2017 | Hirabayashi | H01L 27/0727 |
| 2017/0110535 A1* | 4/2017 | Yilmaz | H01L 21/30604 |
| 2017/0200784 A1* | 7/2017 | Shirakawa | H01L 29/0634 |
| 2017/0288026 A1* | 10/2017 | Hikasa | H01L 21/32 |
| 2017/0317076 A1* | 11/2017 | Shen | H01L 21/823437 |
| 2017/0345817 A1* | 11/2017 | Nishimura | H01L 23/52 |
| 2017/0373141 A1* | 12/2017 | Yoshida | H01L 21/8234 |
| 2018/0012762 A1* | 1/2018 | Mukai | H01L 29/0638 |
| 2018/0166279 A1* | 6/2018 | Tamura | H01L 29/0638 |
| 2019/0097002 A1* | 3/2019 | Nakanishi | H01L 29/456 |
| 2020/0105874 A1* | 4/2020 | Yilmaz | H01L 29/0638 |
| 2020/0350170 A1* | 11/2020 | Tamura | H01L 29/0834 |
| 2021/0265492 A1* | 8/2021 | Takishita | H01L 29/407 |

\* cited by examiner

METHOD FOR MANUFACTURING IGBT DEVICE

CROSS-REFERENCES TO RELATED APPLICATIONS

This application claims the priority to Chinese patent application No. CN 202010897106.1 filed at CNIPA on Aug. 31, 2020, and entitled "METHOD FOR MANUFACTURING IGBT DEVICE", the disclosure of which is incorporated herein by reference in entirety.

TECHNICAL FIELD

The present disclosure relates to the field of semiconductor manufacturing, in particular to a method for manufacturing an IGBT device.

BACKGROUND

With the development of technologies, the insulated gate bipolar transistor (IGBT) has become a power device widely applied in the field of power electronics. The types of IGBT devices include a punch through (PT) type, a non-punch through (NPT) type, a field stop (FS) type, etc. An FS layer in the FS-type IGBT device is mainly used to block the electric field such that the electric field in an N-type drift region is in a trapezoid distribution, so as to reduce the thickness and doping concentration of the N-type drift region and reduce the break-over voltage drop.

Currently, the FS-type IGBT device manufactured on an 8-inch substrate adopts a floating zone method (FZ) substrate, while a 12-inch substrate device can only adopt a magnetic field applied Czochralski method (MCZ) substrate due to the limitations on the substrate manufacturing technology. In wafer processing factories, power devices and IC products generally share the production line, and phosphosilicate glass (PSG) or borophosphosilicate glass (BPSG) cannot be used for manufacturing FS-type IGBT devices on 12-inch wafers.

Under the influence of the above two factors, the FS-type IGBT device manufactured using a 12-inch substrate has a more serious breakdown voltage walk out phenomenon than the FS-type IGBT device manufactured using an 8-inch substrate.

BRIEF SUMMARY

According to some embodiments in this application, a method for manufacturing an IGBT device is disclosed in the following steps: forming a source of the IGBT device in a substrate, wherein the substrate is an MCZ substrate; performing annealing processing on the substrate, wherein a layer of oxide is formed on the surface of the source during an annealing process; forming an interlayer dielectric layer on the substrate, wherein the interlayer dielectric layer is comprised of a silicon nitride layer, a first type oxide layer, and a second type oxide layer, and a material used to form the first type oxide layer is different from a material used to form the second type oxide layer; and performing nitrogen annealing processing on the substrate.

In some examples, wherein the forming an interlayer dielectric layer on the substrate, comprising: performing an LPCVD process to form the silicon nitride layer on the substrate and performing PECVD processes to sequentially form the first type oxide layer and the second type oxide layer on the silicon nitride layer.

In some examples, the material of the first type oxide layer is silicon rich oxides, and the material of the second type oxide layer is oxides produced by means of chemical reactions.

In some examples, the material of the first type oxide layer is oxides produced by a chemical reaction between $O_3$ and TEOS, and the material of the second type oxide layer is oxides obtained from decomposition of TEOS.

In some examples, the diameter of the substrate is 12 inches.

In some examples, the IGBT device is an FS-type IGBT device.

In some examples, before forming a source of the IGBT device on a substrate, the method further comprising: forming a gate structure of the IGBT device.

In some examples, wherein forming a source of the IGBT device in a substrate, comprising: implanting N-type doping ions into a body of the IGBT device by means of an ion implantation process, to form the source.

DETAILED DESCRIPTION OF THE DISCLOSURE

Figure 1:
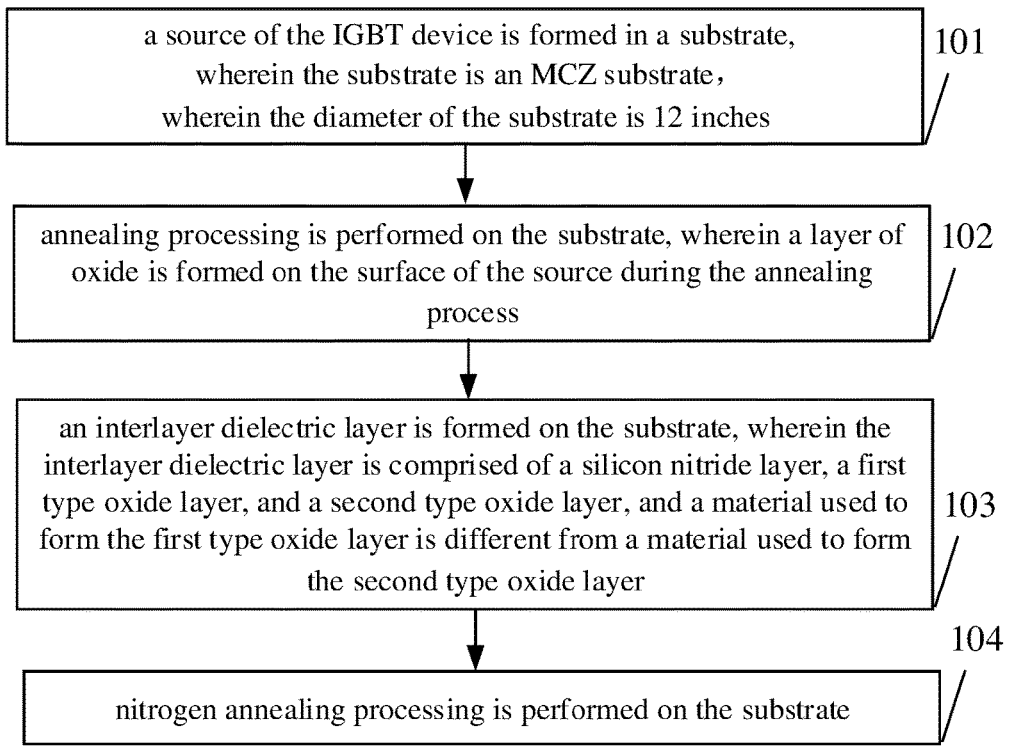
FIG. 1 is a flow chart of a method for manufacturing an IGBT device, according to one embodiment of the present application.
Figure 2:
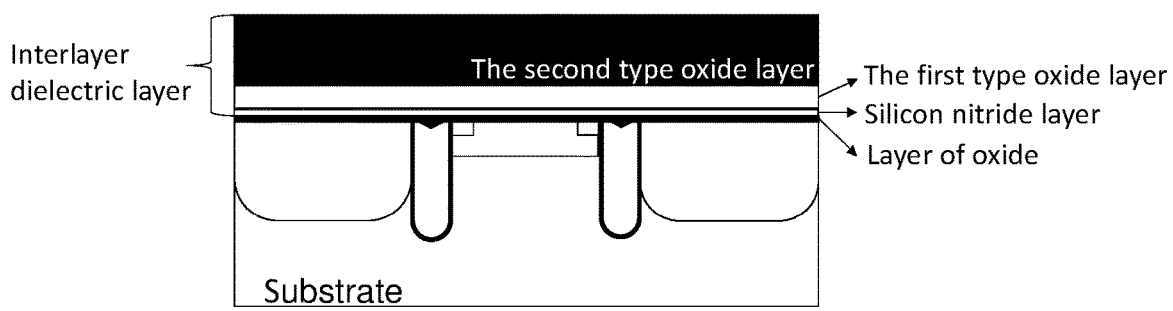
FIG. 2 is a schematic diagram of the IGBT structure corresponding to FIG. 1.

The technical solution of the present application will be clearly and completely described below with reference to the drawings. Obviously, the described embodiments are part of the embodiments of the present application, instead of all of them. Based on the embodiments in the present application, all other embodiments obtained by one skilled in the art without involving any inventive skill shall fall into the protection scope of the present application.

In the description of the present application, it should be noted that the orientation or position relationship indicated by the terms "center", "upper", "lower", "left", "right", "vertical", "horizontal", "inner", "outer", etc. is based on the orientation or position relationship shown in the drawings, intended only for the convenience of describing the present application and simplifying the description, rather than indicating or implying that the apparatus or element referred to necessarily has a specific orientation or is configured or operated in a specific orientation, and thus cannot be construed as a limitation on the present application. In addition, the terms "first", "second", and "third" are used for descriptive purposes only, and cannot be construed as indicating or implying relative importance.

In the description of the present application, it should be noted that, unless otherwise clearly specified and limited, the terms "mounting", "coupling", and "connecting" should be understood in a broad sense, for example, a connection can be a fixed connection, a detachable connection, or an integrated connection, can be a mechanical connection or an electrical connection, can be a direct connection, an indirect connection implemented by means of an intermedium, or an internal connection between two components, and can be a wireless connection or a wired connection. One skilled in the art could understand the specific meanings of the above terms in the present application on the basis of specific situations.

In addition, the technical features involved in different embodiments of the present application described below can be combined with each other in the case of no conflict.

One embodiment of the present application provides a method for manufacturing an IGBT device, including the following steps illustrated in FIG. 1.

In step 101, a source of the IGBT device is formed in a substrate, wherein the substrate is an MCZ substrate.

A substrate is provided, and the substrate is used at least for manufacturing the IGBT device.

The source of the IGBT device is formed in a region on the substrate used for manufacturing the IGBT device.

In some examples, the diameter of the MCZ substrate is 12 inches.

In step 102, annealing processing is performed on the substrate, wherein a layer of oxide is formed on the surface of the source during the annealing process.

The annealing processing is performed on the substrate, and during the annealing process, the oxide is formed on the exposed silicon surface of the substrate; and during the annealing process, the silicon surface corresponding to the source is exposed and the oxide is formed on the surface of the source.

In some cases, after the source of the IGBT device is formed, the substrate is cleaned, and then the annealing processing is performed on the substrate; and after the annealing processing ends, the substrate is cleaned again.

In step 103, an interlayer dielectric layer is formed on the substrate, wherein the interlayer dielectric layer is comprised of a silicon nitride layer, a first type oxide layer, and a second type oxide layer, and a material used to form the first type oxide layer is different from a material used to form the second type oxide layer.

The silicon nitride layer is formed on the substrate, the first type oxide layer is formed on the silicon nitride layer, and the second type oxide layer is formed on the first type oxide layer.

The silicon nitride layer in the interlayer dielectric layer is used to block external mobile charges, so as to improve a breakdown voltage walk out (BV walk out) phenomenon of the IGBT device.

The material used to form the first type oxide layer and the material used to form the second type oxide layer are determined according to performance requirements of the IGBT device, and are not limited in the embodiments of the present application.

The thickness of each layer in the interlayer dielectric layer is determined according to design requirements of the IGBT device, and is not limited in the embodiments of the present application.

In step 104, nitrogen annealing processing is performed on the substrate.

During a nitrogen annealing process, densification processing is performed on the oxide layer in the interlayer dielectric layer by means of pure nitrogen ($N_2$), so as to satisfy a requirement of the IGBT device for the film quality of the interlayer dielectric layer.

The density of the oxide layer obtained by means of CVD in the interlayer dielectric layer is improved.

In summary, in processes of manufacturing the IGBT device, the material of the interlayer dielectric layer of the IGBT device is improved, that is, the interlayer dielectric layer is comprised of the silicon nitride layer, the first type oxide layer, and the second type oxide layer, and the nitrogen annealing processing is performed after the interlayer dielectric layer is formed, so as to improve the density of the oxide film layer in the interlayer dielectric layer, such that a requirement of the IGBT device for the film quality of the interlayer dielectric layer can still be satisfied in the case where PSG or BPSP is not used as the material of the interlayer dielectric layer during the process of manufacturing the IGBT device.

The performance of the IGBT device has improved, the production process of manufacturing the IGBT device using the MCZ substrate has optimized. In addition, the quality effect of the IGBT device produced using a 12-inch wafer can be optimized.

If the manufacturing process of the FS-type IGBT device is applied to a wafer with a diameter of 12 inches, the breakdown voltage walk out phenomenon of the FS-type IGBT device is more serious than the breakdown voltage walk out phenomenon of the FS-type IGBT device manufactured on an 8-inch wafer, easily leading to a problem of the FS-type IGBT device being incapable of normally operate. In order to solve the problem in the application of the manufacturing process of the FS-type IGBT device to the wafer with a diameter of 12 inches, another embodiment of the present disclosure provides a method for manufacturing an IGBT device, and the method includes the following steps.

In step 201, a gate structure of the IGBT device is formed.

A substrate is provided, the substrate is an MCZ substrate, and the substrate is used at least for manufacturing the IGBT device. The diameter of the substrate is 12 inches.

In an example, a drift of the IGBT device is formed by an N-type lightly doped region; and a P-type body of the IGBT device is formed in a predetermined region by means of an ion implantation process.

The gate structure of the IGBT device is formed on the substrate.

In some examples, the gate structure of the IGBT device is a planar gate structure; in some examples, the gate structure of the IGBT device is a trench gate structure.

In step 202, a source of the IGBT device is formed in a substrate.

In an example, N-type doping ions are implanted into the body of the IGBT device by mean of an ion implantation process, so as to form the source of the IGBT device on the top of the body.

In some cases, wet cleaning process is performed on the substrate after the source of the IGBT device is formed.

In step 203, annealing processing is performed on the substrate, wherein a layer of oxide is formed on the surface of the source during the annealing process.

In some cases, the substrate is cleaned after the annealing processing is performed on the substrate.

In step 204, an LPCVD process is performed to form a silicon nitride layer on the substrate.

The silicon nitride layer is used to block external mobile charges, so as to improve breakdown voltage walk out of the FS-type IGBT device.

In step 205, PECVD processes are performed to form a first type oxide layer and a second type oxide layer sequentially.

A first type oxide is deposited on the surface of silicon nitride by means of the PECVD process, to form the first type oxide layer; and a second type oxide is deposited on the surface of the first type oxide layer by means of the PECVD process, to form the second type oxide layer.

The material used to form the first type oxide layer is different from the material used to form the second type oxide layer.

In one example, the material of the first type oxide layer is silicon rich oxide (SRO), and the material of the second type oxide layer is oxide produced by means of chemical reactions.

In another example, there are high polysilicon steps in the IGBT device structure, and oxide material with well step coverage is used to grow the oxide layer. For example, the material of the first type oxide layer is oxide produced by a reaction between $O_3$ and TEOS, and the material of the second type oxide layer is oxide obtained from decomposition of TEOS.

An interlayer dielectric layer of the IGBT device is comprised of the silicon nitride layer, the first type oxide layer, and the second type oxide layer.

In step 206, nitrogen annealing processing is performed on the substrate.

During a nitrogen annealing process, densification processing is performed on the first type oxide layer and the second type oxide layer in the interlayer dielectric layer by means of pure nitrogen ($N_2$), so as to satisfy a requirement of the IGBT device for the film quality of the interlayer dielectric layer.

If a 12-inch MCZ substrate is used to manufacture the FS-type IGBT device and the FS-type IGBT device shares a production line with an IC product, PSG or BPSG cannot be used as the material of the interlayer dielectric layer of the FS-type IGBT device, thereby affecting the performance of the FS-type IGBT device. In the embodiment of the present application, the material of the interlayer dielectric layer of the FS-type IGBT device is improved, and the pure nitrogen annealing processing is performed to densify the oxide film in the interlayer dielectric layer, such that the requirement of FS-type IGBT device for the film quality of the interlayer dielectric layer is satisfied, thereby improving the breakdown voltage walk out phenomenon of the FS-type IGBT device on a 12"-production line, and improving the product performance.

Obviously, the foregoing embodiments are merely for clear description of made examples, and are not limitations on the implementations. For those of ordinary skill in the art, other different forms of changes or modifications can be made on the basis of the above description. There is no need and cannot be exhaustive for all implementations. And, the obvious changes or modifications introduced thereby are still within the protection scope of this application.

What is claimed is:

1. A method for manufacturing an IGBT device, comprising:
    forming a source of the IGBT device in a substrate, wherein the substrate is an MCZ substrate, and wherein a diameter of the substrate is 12 inches;
    performing annealing processing on the substrate, wherein a layer of oxide is formed on the surface of the source during an annealing process;
    forming an interlayer dielectric layer on the substrate, wherein the interlayer dielectric layer is comprised of a silicon nitride layer, a first type oxide layer, and a second type oxide layer, and a material used to form the first type oxide layer is different from a material used to form the second type oxide layer; and
    performing nitrogen annealing processing on the substrate.

2. The method for manufacturing an IGBT device, according to claim 1, wherein the forming an interlayer dielectric layer on the substrate, comprising:
    performing an LPCVD process to form the silicon nitride layer on the substrate; and
    performing PECVD processes to sequentially form the first type oxide layer and the second type oxide layer on the silicon nitride layer.

3. The method for manufacturing an IGBT device, according to claim 2, wherein the material of the first type oxide layer is silicon rich oxides, and the material of the second type oxide layer is oxides produced by means of chemical reactions.

4. The method for manufacturing an IGBT device, according to claim 2, wherein the material of the first type oxide layer is oxide produced by a chemical reaction between O3 and TEOS, and the material of the second type oxide layer is oxide obtained from decomposition of TEOS.

5. The method for manufacturing an IGBT device, according to claim 1, wherein the IGBT device is an FS-type IGBT device.

6. The method for manufacturing an IGBT device, according to claim 1, wherein before forming a source of the IGBT device on a substrate, the method further comprising:
    forming a gate structure of the IGBT device.

7. The method for manufacturing an IGBT device, according to claim 1, wherein forming a source of the IGBT device in a substrate, comprising:
    implanting N-type doping ions into a body of the IGBT device by means of an ion implantation process, to form the source.

* * * * *